United States Patent [19]

Grado

[11] Patent Number: 4,879,694
[45] Date of Patent: Nov. 7, 1989

[54] DIFAR DEMULTIPLEXER CIRCUIT
[75] Inventor: Gilbert R. Grado, Tustin, Calif.
[73] Assignee: Rockwell International Corporation, El Segundo, Calif.
[21] Appl. No.: 164,050
[22] Filed: Mar. 4, 1988
[51] Int. Cl.[4] .............................................. H04B 1/59
[52] U.S. Cl. ........................................................ 367/3
[58] Field of Search ........................................ 367/3-6
[56] References Cited
U.S. PATENT DOCUMENTS

| 3,870,989 | 3/1975 | Mallet | 367/3 |
|---|---|---|---|
| 3,987,404 | 10/1976 | Woodruff | 367/3 |
| 4,393,483 | 7/1983 | Hammond et al. | 367/13 |

Primary Examiner—Thomas H. Tarcza
Assistant Examiner—Daniel T. Pihulic
Attorney, Agent, or Firm—H. Fredrick Hamann; George A. Montanye; James F. Kirk

[57] ABSTRACT

A demultiplexer circuit responsive to a composite input signal from a sonobouy. The invention circuit has a filter and comparator means responsive to the composite signal for providing a filtered frequency pilot reference signal. The filtered frequency pilot reference signal has a frequency equal to one half the frequency of a reference carrier signal in the composite signal. The invention circuit has a sine demodulator means responsive to the composite signal and to an east/west demodulator signal for providing an east referenced output signal. A cosine demodulator means is responsive to the composite signal and to a north/south demodulator signal for providing a demodulated phase pilot signal and the north referenced output signal. A north/south filter means is responsive to the output signals from the cosine demodulator means for filtering the demodulated phase pilot signal to provide the north referenced output signal. A servo means is responsive to the filtered frequency pilot reference signal and to the demodulated phase pilot signal for generating and controlling the phase of the north/south demodulator signal and the east/west demodulator signal using a single phase locked loop. The servo means is characterized to phase shift the north/south and east/west demodulator signals to adjust the outputs of the sine and cosine demodulator means to remove all error bias measured with respect to ground from the demodulated phase pilot signal.

6 Claims, 10 Drawing Sheets

DIFAR DEMULTIPLEXER CIRCUIT

BACKGROUND OF THE INVENTION

1. Field of the Invention

This invention relates to the field of sonar, and more particularly to the field of demultiplexer circuits used in demultiplexing the multiplexed signal information obtained from DIFAR sonobouys.

DIFAR sonobouys are dropped in numbers by intelligence gathering aircraft into ocean areas that are to be subjected to short term sonar monitoring. As shown in FIGS. 1a and 1b respectively, the DIFAR sonobouys typically have a first dipole directional sonar hydrophones that respond to sound along a sonobouy (Y) axis, a second dipole directional hydrophones that respond to sound along a sonobouy (X) axis, and a non-directional or omni hydrophone that responds to sound with uniform sensitivity on all level radials from the instrument.

The DIFAR sonobouy is typically characterized to float at a predetermined depth for a predetermined duration. The (X) and (Y) axes are orthogonal and are kept float level by operation of the hydrostatic design of the sonobouy. The sonobouy is equipped with a fluxgate compass. No means is provided to orientate the sonobouy once it is in the water.

Sounds received by the hydrophones in the sonobouy are multiplexed in accordance with a predetermined DIFAR format for transmission to an aircraft sent to record the received data.

The DIFAR format requires that the following conventions be adopted. Using a top view of the sonobouy, angle Phi is measured clockwise from magnetic north to the +Y axis. Angle Theta is measured clockwise from the +Y axis to the target location. When dropped into the ocean, the angle phi can be any angle from 0 to 360 degrees. The sonobouy orientation can continually change due to wave action. The relative amplitude and polarity of target signals from the Y axis hydrophones varies as the cosine of angle theta. The relative amplitude and polarity of target signals from the X axis hydrophones varies as the Sine of angle theta. The omni hydrophone signal is positive in all quadrants of angle theta.

The sonobouy circuitry provides a 15.0 kilohertz phase reference signal. The 15.0 kilohertz phase reference signal is phase shifted or delayed in time by an interval proportional to the magnetic heading angle phi to generate a signal referred to as the phase pilot signal.

The Y axis hydrophone information is referred to as cosine channel information. The X axis channel information is referred to as sine channel information. The cosine channel information is multiplied by a reference carrier signal having a frequency of 15.0 kilohertz. The reference carrier signal leads the 15.0 Kilohertz phase reference by 90 degrees. All delays are measured with respect to the phase reference signal. The sine channel information is multiplied by a quadrature reference carrier signal having a frequency of 15.0 kilohertz and is phased shifted to lead the reference carrier of the cosine channel by 90 degrees.

The sonobouy also provides a constant amplitude 7.5 Kilohertz frequency pilot signal. The frequency pilot signal is by definition exactly one half the frequency of the phase reference signal.

The omni signal is not multiplied by a carrier. The bandpass of the omni signal information is typically under 2.5 kilohertz. An RF carrier is modulated with the sum of the frequency pilot, the phase pilot, the cosine channel, sine channel and the omni signal information and transmitted by the DIFAR sonobouy to the sampling aircraft to be recorded on board the aircraft or for retransmittal to a receiving station as a single channel signal for demultiplexing by the invention DIFAR demultiplexing circuit.

2. Prior Art

Previous DIFAR demultiplexer circuits used two or more phase locked servos. The invention DIFAR demultiplexer circuit uses one phase locked servo loop with a digital correction in 45 degree steps and analog adjustment of the quadrature phase signal to the phase pilot.

SUMMARY OF THE INVENTION

It is an objective of this invention to provide a simplified DIFAR demultiplexer circuit having only one phase locked servo loop.

The invention DIFAR demultiplexer circuit has a filter and comparator means responsive to a composite signal derived from a single carrier transmission from the sampling aircraft for providing a filtered frequency pilot reference signal at 7.5 kilohertz having a frequency equal to one half the frequency of the reference fixed frequency carrier.

A sine demodulator means is responsive to the composite signal and to an east/west demodulator signal from a servo means for providing the east referenced output signal.

A cosine demodulator means is responsive to the composite signal and to a north/south demodulator signal for providing a demodulated phase pilot signal and the north referenced output signal.

A N/S Low Pass Filter is responsive to the output of the cosine demodulator means for filtering the demodulated phase pilot signal to provide the north referenced output signal.

A servo means responsive to the frequency pilot reference signal and to said demodulated phase pilot signal for generating and controlling the phase of said north/south demodulator signal and said east/west demodulator signal using a single phase locked loop. The servo means is characterized to phase shift the north/south and east/west demodulator signals to adjust the outputs of the sine and cosine demodulator means to remove all error bias from the demodulated phase pilot signal. The error bias is measured with respect to a reference potential such as ground.

DESCRIPTION OF THE PREFERRED EMBODIMENT

The invention demultiplexer circuit responds to a composite input signal from a sonobouy. The composite signal from the sonobouy has signal components characterized as a received audio signal having cosine and sine components.

Figure 1B:
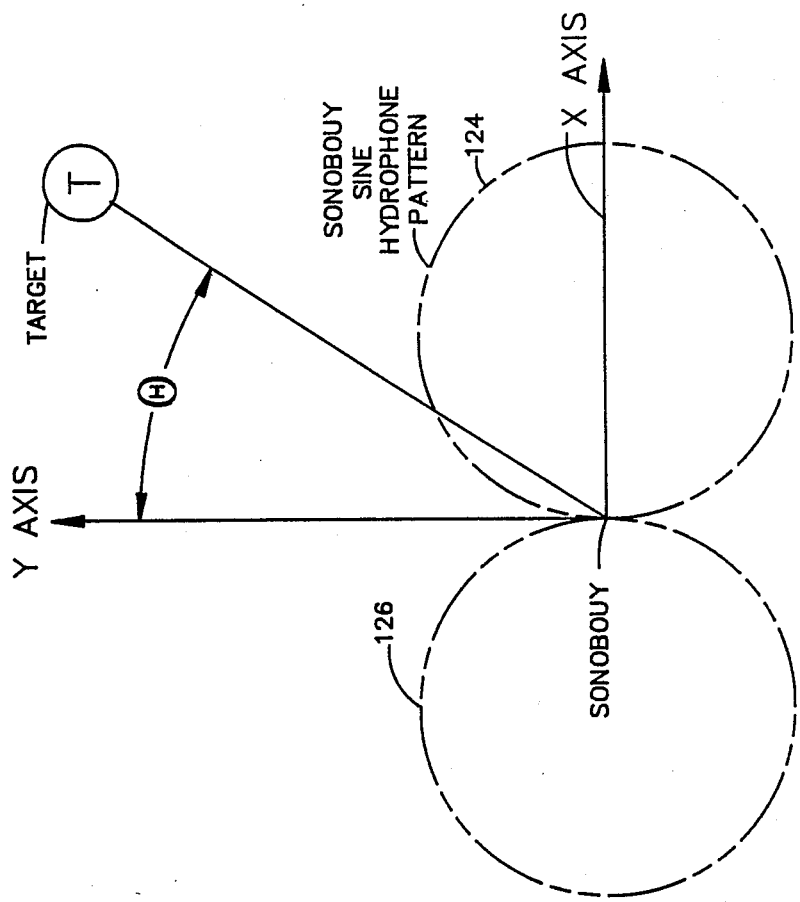
FIGS. 1a, 1b depict the relationship between hydrophone gain patterns and the reference system of a sonobouy.
Figure 1A:
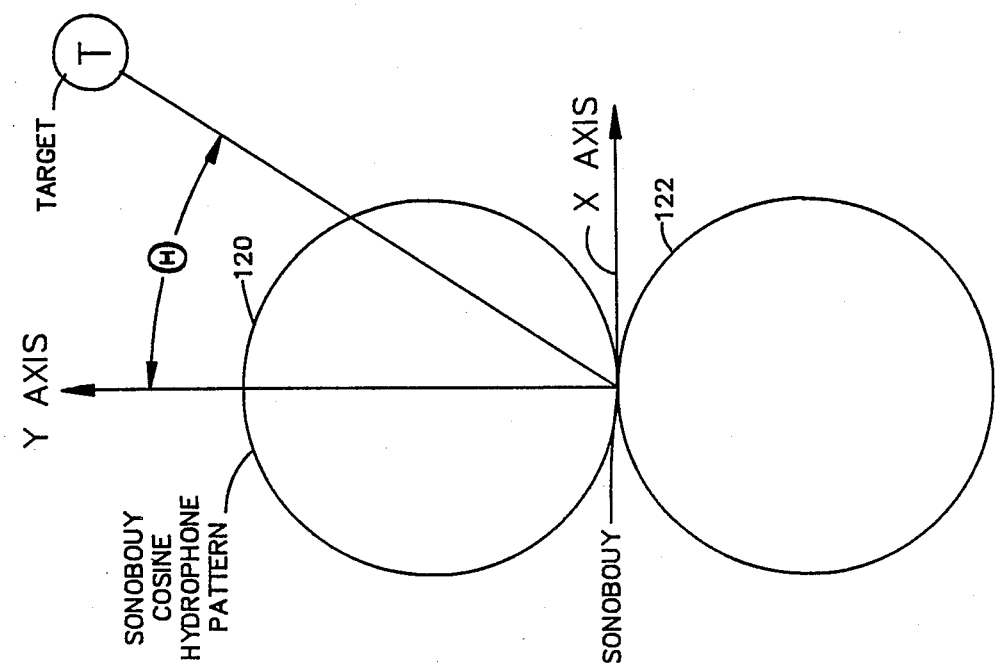

Referring to FIG. 1a, and FIG. 1b, the source of the audio signal is shown as a circle with an upper case T. The Y axis of the sonobouy is a reference axis. The hydrophone on the Y axis has a dual lobe circular gain pattern 120, 122. The hydrophone on the X axis has a dual lobe gain pattern 124, 126. The amplitude of the audio signal received by the Y axis hydrophone is proportional to the amplitude of the received audio signal times the cosine of the angle between the sonobouy Y axis and the radial to the target. The amplitude of the audio signal received by the X axis hydrophone is proportional to the amplitude of the received audio signal times the sine of the angle between the sonobouy X axis and the radial to the target. The Y and X axis represent the reference frame of the sonar bouy receiving the audio signal.

Figure 2:
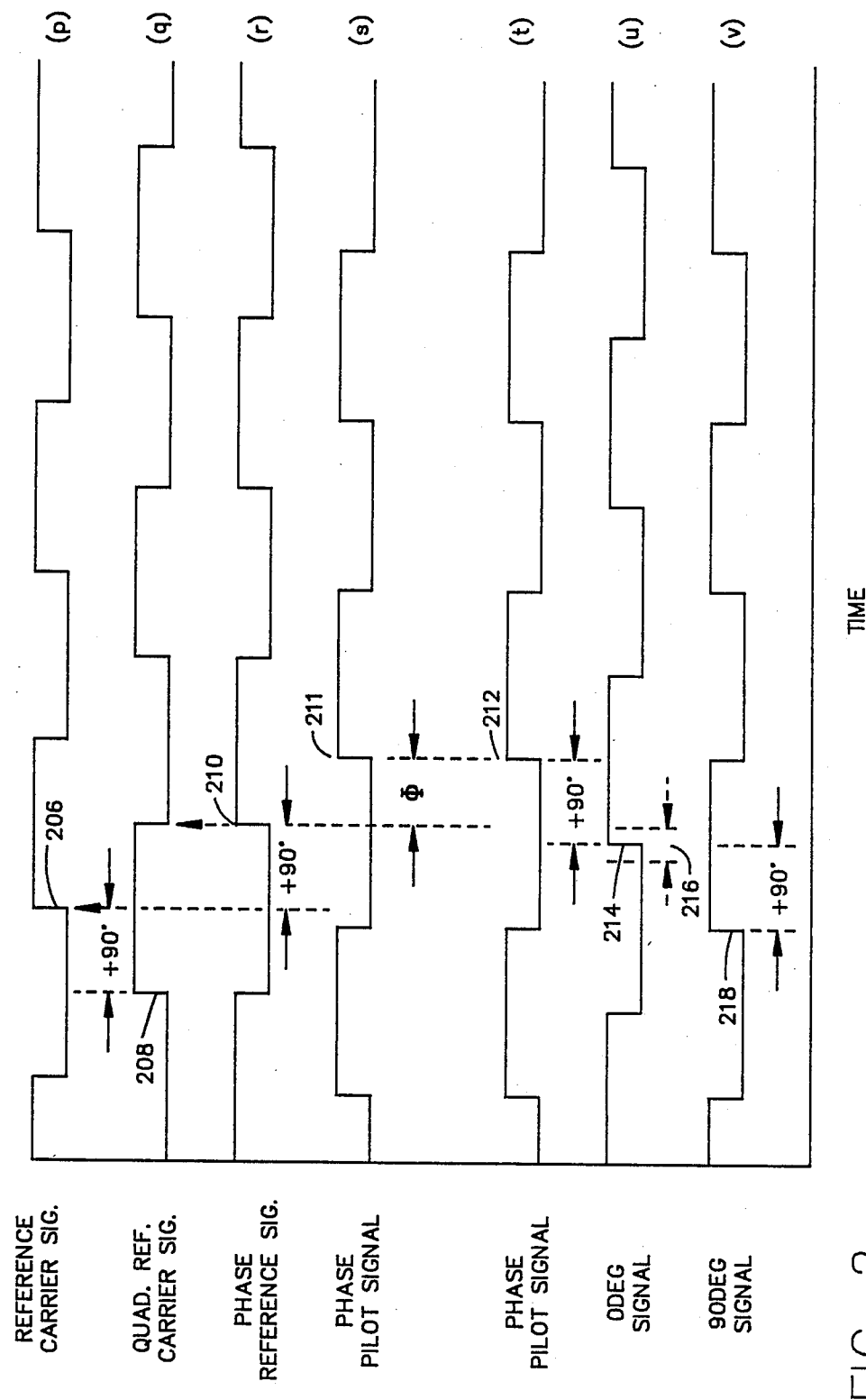
FIG. 2 is a timing diagram showing the phasing relationships between the reference signals depicted as waveforms (p), (q), (r) and (s) in a sonobouy and the reference signals within the DIFAR multiplexer invention circuit depicted as waveforms (t), (u) and (v).

Referring to FIG. 2, the cosine component of the transmitted sonobouy signal is modulated by a reference carrier signal represented by waveform (p) and the sine component is modulated by a quadrature reference carrier signal represented by waveform (q). The quadrature reference carrier signal is characterized as leading the reference carrier signal by 90 degrees.

A constant amplitude fixed frequency pilot (not shown in FIG. 2) is transmitted and is present in the composite received signal. The fixed frequency pilot has a frequency equal to one half the frequency of said reference carrier signal.

A constant amplitude phase pilot signal such as the signal represented by waveform (s) is transmitted with the composite signal from the sonobouy. The phase pilot signal has a frequency equal to the frequency of said reference carrier signal.

The sonobouy signal convention requires the production of a phase reference signal such as waveform (r) within the sonobouy electronics. This signal is used as an internal reference and is not transmitted as part of the composite signal. The reference carrier signal (p) leads the phase reference signal (r) by 90 degrees.

The phase pilot signal (s) is phase shifted to lag the phase reference signal (r) by an angle proportional to the heading angle, represented by angle phi, measured between magnetic north and the reference axis of said reference frame.

Figure 1C:
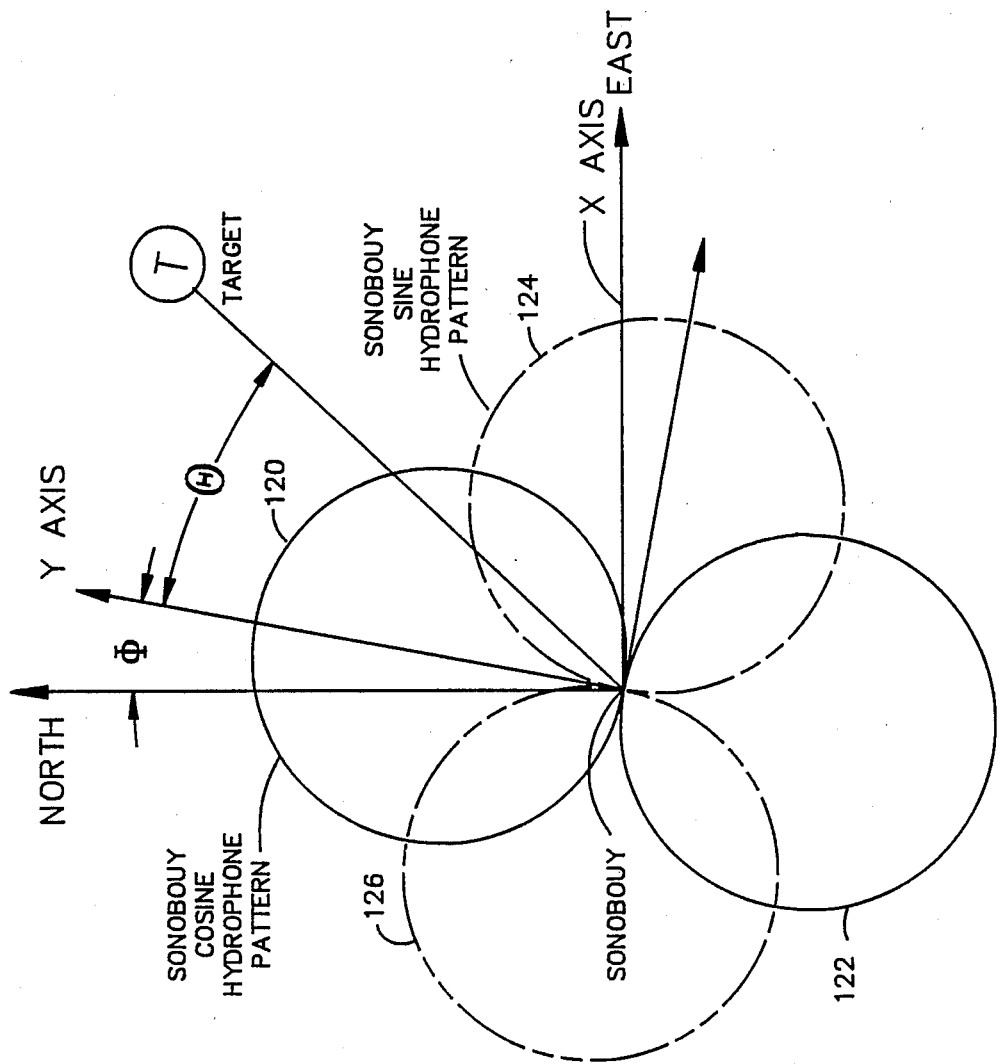
FIG. 1c depicts the relationship between the reference system of the sonobouy and a magnetic north reference coordinate system.
Figure 3:
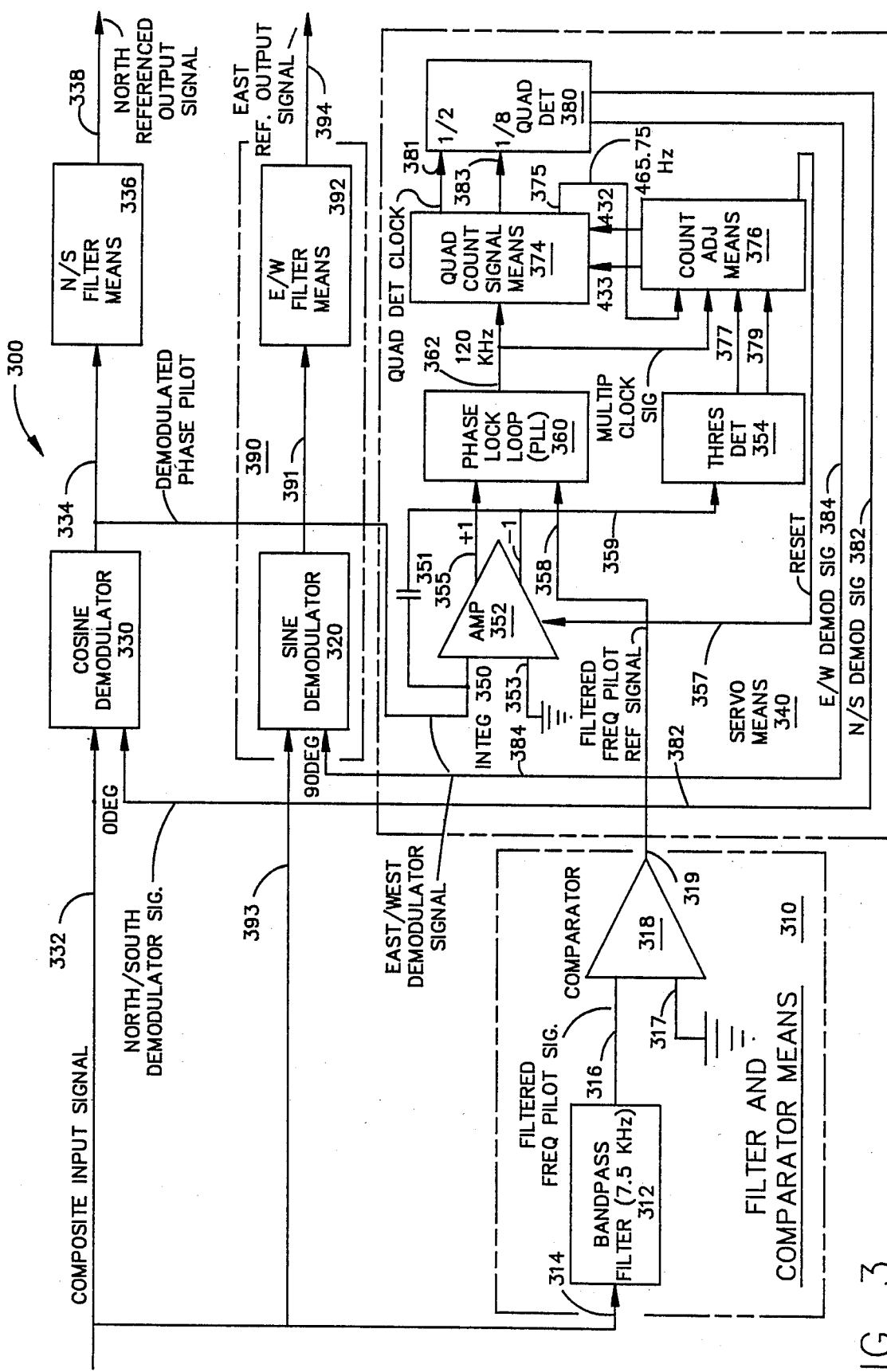
FIG. 3 is a block diagram of the DIFAR multiplexer.

Referring to FIG. 3, upper right corner, the block diagram of the invention demultiplexer circuit providing a north referenced output signal proportional to the amplitude of the received audio signal from target (T) in FIG. 1c times the cosine of the sum of the angles phi plus theta.

Referring to FIG. 3, upper right corner, the block diagram of the invention demultiplexer circuit also provides an east referenced output signal proportional to the amplitude of the received audio signal from target (T) in FIG. 1c times the sine of the sum of the angles phi plus theta.

Referring to FIG. 3, block 310 represents a filter and comparator means responsive to the composite signal at input terminal 314 for providing a filtered frequency pilot reference signal at terminal 319 having a frequency equal to one half the frequency of the reference carrier signal, i.e. waveform (r) in FIG. 2.

Referring to FIG. 3, phantom block 390 shows a sine demodulator means responsive to the composite signal at input terminal 393 and to an east/west demodulator signal at input terminal 384 for providing the east referenced output signal at output terminal 394.

Block 330 represents a cosine demodulator means responsive to the composite signal at input terminal 332 and to a north/south demodulator signal at input terminal 382 for providing a demodulated phase pilot signal at output terminal 334 in combination with the unfiltered north referenced output signal.

Block 336 represents a north/south filter means responsive to the output signals at terminal 334 from the cosine demodulator means 330 for filtering the combined demodulated phase pilot signal and unfiltered north referenced output signal to provide the north referenced output signal at output terminal 338.

Phantom block 340 of FIG. 3 represents a servo means responsive to the filtered frequency pilot reference signal at input terminal 358 and to the demodulated phase pilot signal at terminal 334 for generating and controlling the phase of the north/south demodulator signal at output terminal 382 and the east/west demodulator signal at output terminal 384 using a single phase locked loop. The servo means is characterized to phase shift the north/south and east/west demodulator signals at output terminals 382, 384 respectively to adjust the outputs of the sine and cosine demodulator means 320, 330 respectively to remove all error bias from the demodulated phase pilot signal at input terminal 334. The error bias is measured with respect to a reference potential such as ground at integrator terminal 353.

The filter and comparator means of FIG. 3 within phantom block 310 further describes a bandpass filter, represented by block 312, responsive to the composite signal at terminal 314. The bandpass filter has a center frequency set to equal one half of the reference carrier signal (7.5 KHz) for providing a filtered frequency pilot at terminal 316. Although not shown, the bandpass filter center frequency is selectable by control logic inputs to conform with the speed at which the composite input signal at terminal 314 is received. Typical applications allow the speed of the composite signal to be increased by a factor of 2, 4 or 8 times faster than the real time recorded rate used by the sonobouy.

The filter and comparator means 310 also includes a comparator circuit, represented by block 318, referenced to a reference potential, such as ground at comparator input terminal 317. The comparator circuit is responsive to the filtered frequency pilot at terminal 316 for providing the filtered frequency pilot reference signal at terminal 319.

The filtered frequency pilot reference signal at terminal 319 has a first logic state such as a logic one state in response to the filtered frequency pilot amplitude at terminal 316 exceeding the reference potential such as zero volts at terminal 317. The filtered frequency pilot reference signal at terminal 319 has a second logic state such as a logic zero state in response to the filtered frequency pilot signal amplitude being below the reference potential.

The servo means 340 is further characterized as having an integrator circuit 350 referenced to a referenced potential via terminal 353 such as ground.

The integrator circuit of FIG. 3 is responsive to the error bias in the demodulated phase pilot signal at terminal 334 for providing an integrated phase error signal. Referring again to FIG. 2, the purpose of servo means 340 is to control the phase relationship between waveform (u), the ODEG signal and waveform (t), the PHASE PILOT SIGNAL to cause the ODEG signal to lead the PHASE PILOT SIGNAL by 90 degrees. In operation, the required 90 degree lead angle is in error by a small amount. Reference number 216 in FIG. 2 schematically shows a small deviation range from the required 90 degree position of the ODEG SIGNAL. When controlled, the leading edge 214 of the ODEG SIGNAL leads the leading edge of the PHASE PILOT SIGNAL 212 by 90 degrees.

With the development of a small phase error, the integrated phase error signal out of the integrator at terminal 355 will continue to increase with a first polarity for a leading phase error between the north/south demodulator signal and the phase pilot signal until the error bias in the demodulated phase pilot signal is driven to zero volts.

Referring again to FIG. 2, the integrated phase error signal out of the integrator at terminal 355 will continue to increase with a second polarity for a lagging phase error between the north/south demodulator signal and said phase pilot signal until the error bias in the demodulated phase pilot signal is driven to zero volts.

Figure 4:
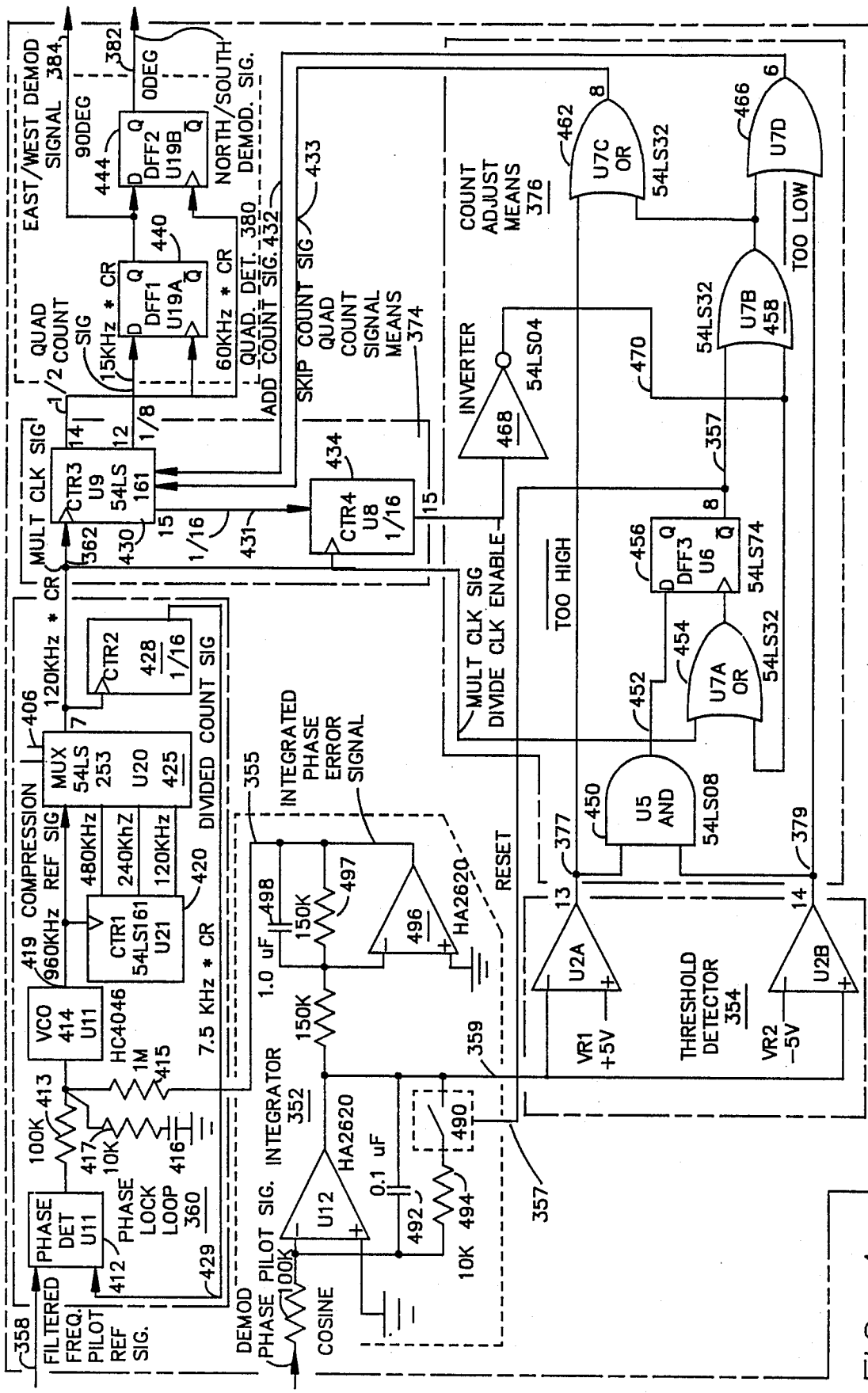
FIG. 4 is a block diagram of the servo means used by the DIFAR multiplexer.

Referring to FIGS. 2, 3 and 4, waveform (v) represents the 90DEG SIGNAL that is provided by the QUAD DET block 380 via signal line 384 to the SINE DEMODULATOR 320. The 90DEG SIGNAL is supplied from flip-flop DFF1 440. The leading edge of waveform (v) 218 leads the leading edge of waveform (u) 214 by 90 degrees as shown in FIG. 2. The 90 degree relationship between the ODEG SIGNAL and the 9ODEG SIGNAL is precisely maintained by the clocked operation of flip-flops 440 and 444.

Referring to FIG. 4, the integrator circuit within phantom block 352 is also shown to be responsive to a reset signal at input terminal 357 for resetting the integrated phase error signal.

Block 354 in FIG. 3 represents a threshold detector circuit responsive to the integrated phase error signal via signal line 359 for providing a positive phase error signal on signal line 377 in response to the integrated phase error signal exceeding a first threshold such as +5 Vdc and a negative phase error signal on signal line 379 in response to the integrated phase error signal exceeding a second threshold such as −5 Vdc.

Block 360 in FIG. 3 represents a PLL (Phase Lock Loop) circuit responsive to the integrated phase error signal via signal line 355 and to the filtered frequency pilot reference signal via signal line 358 for providing a multiple clock signal as an output on signal line 362.

The PLL of FIG. 3 is characterized with greater detail FIG. 4 within phantom block 360. Blocks 412 and 414 represent a conventional phase lock loop device such as the 54HC4046 from RCA or SIGNETICS. The Phase Detector U11, 412 receives the filtered frequency pilot reference signal via signal line 358 and provides a control signal via the coupling network comprising resistors 413, 415, 417 and capacitor 416 to the control input of the VCO U11, 414. The control signal reaching the control input of the VCO adjusts the frequency of the oscillator within the VCO. The output signal of the VCO on signal line 419 is referred to as the compression ratio reference signal with a frequency that is typically set at 960 KHz.

Block U21, 420 represents a binary counter responsive to the compression ratio reference signal for dividing the compression ratio reference signal by a factor of 2, 4 or 8. The output signals from the counter typically have frequencies of 480 KHz, 240 KHz and 120 KHz.

Block U20, 425 represents a 4 to 1 multiplexer responsive to two logic signals on two control lines 406 for the selection of a compression ratio. The invention circuit will process the composite signal on signal 332 at an increased rate. The received composite signal can be received at real time rates increased by factors of 2, 4 and 8 because of the ability to select a compression ratio by the two signal lines controlling MUX U20, 425.

With the selection of a compression ratio compatible with input signal rate, MUX U20, 425 provides the multiple clock signal on signal line 362 at a rate of 120 KHz times the compression ratio. In this specification, the symbol "*" is used to designate multiplication and the symbol "/" is used to designate division. These symbols are consistent with software languages such as BASIC and FORTRAN.

Block CTR2, 428 is a binary counter that divides the multiple clock signal by a factor of 16. The frequency of the output of CTR2 is 7.5 KHz times the compression ratio.

The output of counter CTR2 is referred to as the divided count signal. The divided count signal is coupled via signal line 429 to the reference input of the Phase Detector U11, 412.

Figure 9:
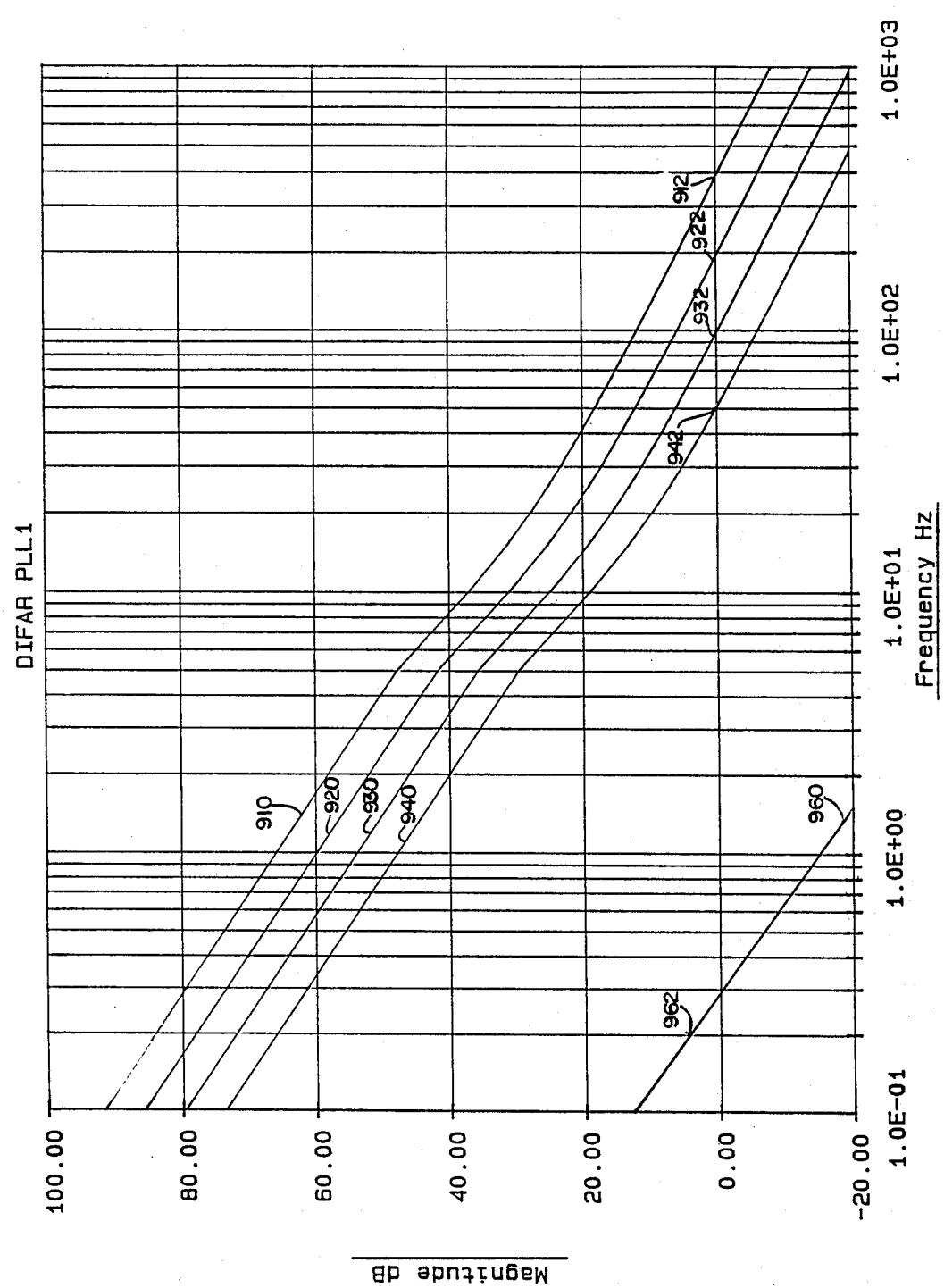
FIG. 9 is a Bode Plot showing the open loop gain versus frequency characteristic of the frequency pilot loop for four individual compression ratios, and the open loop response for the phase pilot control loop.

Referring to FIG. 9, waveforms 910, 920, 930 and 940 represent the open loop gain response curves versus frequency for compression ratios of 8, 4, 2 and 1 respectively of the phase lock loop contained within phantom block 360 in FIG. 4. The loop gain response is measured by applying an input signal on signal line 358 and monitoring the output response on signal line 429. The transfer function of the phase detector block 412 is approximately 4/pi volts per radian. The coupling network consisting of resistor 413, 417 and capacitor 416 has the transfer function of a pole, zero combination represented by (1+0.0s)/(1+0.1s).

The VCO 414 has a transfer function (96000 * pi)/s. In this embodiment, the VCO is adjusted to have a center frequency of 960 KHz with an output range of +96 KHz in response to an input swing of +/−2.0 volts.

The transfer function of the scaling arrangement provided by blocks U21, U20 and CTR2 is CR/128 where the term "CR" represents the selected compression ratio. Gain curves 910, 920, 930 and 940 are shown crossing the 0 db gain line at points 912, 922, 932 and 942. The 0 db crossing of a gain curve typically represents the principle corner or roll off characteristic of the closed loop response of the PLL system.

Referring to FIGS. 3 and 9, the gain curve 960 represents the open loop gain response of the phase pilot control loop comprising the cosine demodulator 330, the integrator 350, the phase lock loop 360, the quad count signal means 374 and the quad detector 380. It is an objective of the design of the preferred embodiment to establish a frequency spread of at least two decades between the 0 db crossing of the phase pilot control loop gain response characteristic at point 962 and the respective 0 db crossings for the response characteristics of the PLL at points 912, 922, 932 and 942.

Referring to FIG. 4, the purpose of the inverted integrated phase error signal input to the phase lock loop within phantom block 360 is to control the phase relationship between the divided count signal on signal line 429 and the filtered frequency pilot reference signal on signal line 358. The frequency of the divided count signal is exactly one half the frequency of the quad count signal out of U9-12 by its operation as a binary counter. A phase shift of the divided count signal on signal line 429 with respect to the filtered frequency pilot reference signal on signal line 358 will result in a phase shift of twice the same value between the quad count signal and the filtered frequency pilot reference signal.

The mechanization of the circuit of FIG. 4 is scaled to provide a 45 degree change in phase of the quad count signal in response to a 5 volt change of the inverted integrated phase error signal on signal line 355. The phase shift produced by the generation of a skip count or an add count to U9, to be discussed later, results in a 45 degree phase shift between the quad count signal and the filtered frequency pilot reference signal.

As the integrated phase error signal exceeds the threshold voltage of the threshold detector a skip count or add count results in a 45 degree correction of counter U9 and the integrator is reset concurrent with the skip count or add count to offset the induced 45 degree phase shift. The integrator now operates to provide an integrated phase error signal at approximately zero volts at its output to adjust the phase shift of the north south demodulator signal shown as waveform (u) in FIG. 2 to lead the phase pilot signal (t) by 90 degrees. Continued drift of the sonobouy reference axis, i.e. the Y axis as shown in FIG. 1c, relative to magnetic north represented by angle phi beyond 45 degrees results in another correction by the count adjust means circuit 376.

Referring to FIGS. 3 and 4, block 374 represents a quadrature count signal means responsive to the multiple clock signal via signal line 362 from MUX U20 as shown as waveform (a) in FIGS. 5, 6, 7 and 8. Block 374 also receives a skip count signal via signal line 433 and an add count signal via signal 432 for dividing the frequency of the multiple clock signal by a first predetermined integer such as eight (8) to provide a quadrature count signal on pin U9-12 as shown as waveform (d) of FIGS. 5, 6, 7 and 8.

The mechanization of the quadrature count signal means uses conventional TTL 54LS161 binary counters for this function. The quadrature count signal means of phantom block 374 divides the frequency of the multiple clock signal by a second predetermined integer such as two (2) to provide a quadrature count clock signal out of pin U9-14 as shown as waveform (c) of FIGS. 5, 6, 7 and 8.

The quadrature count signal means of phantom block 374 divides the frequency of the multiple clock signal by a third predetermined integer such as 256 by operation of counters U9 and U8 to provide a divided clock enable signal out of pin U8-15 shown as waveform (f) to an input to the count adjust means represented by phantom block 376.

The signal at U9-15 shown as waveform (e) on FIGS. 5, 6, 7 and 8 represents the carryout signal on signal line 431 to enable counter UB to increment by one count every sixteen cycles of the multiple clock signal on signal line 362.

The production of a skip count or an add count to U9 results in the equivalent of a 45 degree phase shift of the 15 KHz quad count signal occurring with respect to the 7.5 KHz filtered frequency pilot reference signal.

Referring to FIG. 4, phantom block 380 represents a quadrature detector circuit responsive to the quadrature count signal from U9-12 and the quadrature count clock signal from U9-14 for transferring the state of the quadrature count signal to the east west demodulator signal in response to a quadrature count clock signal to provide said east west demodulator signal as an output on signal line 384 and for transferring the state of said east west demodulator signal to the north south demodulator signal in response to the quadrature count clock signal from U9-14 to provide the north south demodulator signal on signal line 382. The east west demodulator signal is characterized to lead the north south demodulator signal by ninety degrees.

Phantom block 376 represents a count adjust means responsive to the multiple clock signal via signal line 362 and represented by waveform (a) in FIGS. 5, 6, 7 and 8. The count adjust means is responsive to the divided clock enable signal from U8-15 represented by waveform (f) as a transition from a low state at 518 to a high state 520 on FIG. 5.

Figure 6:
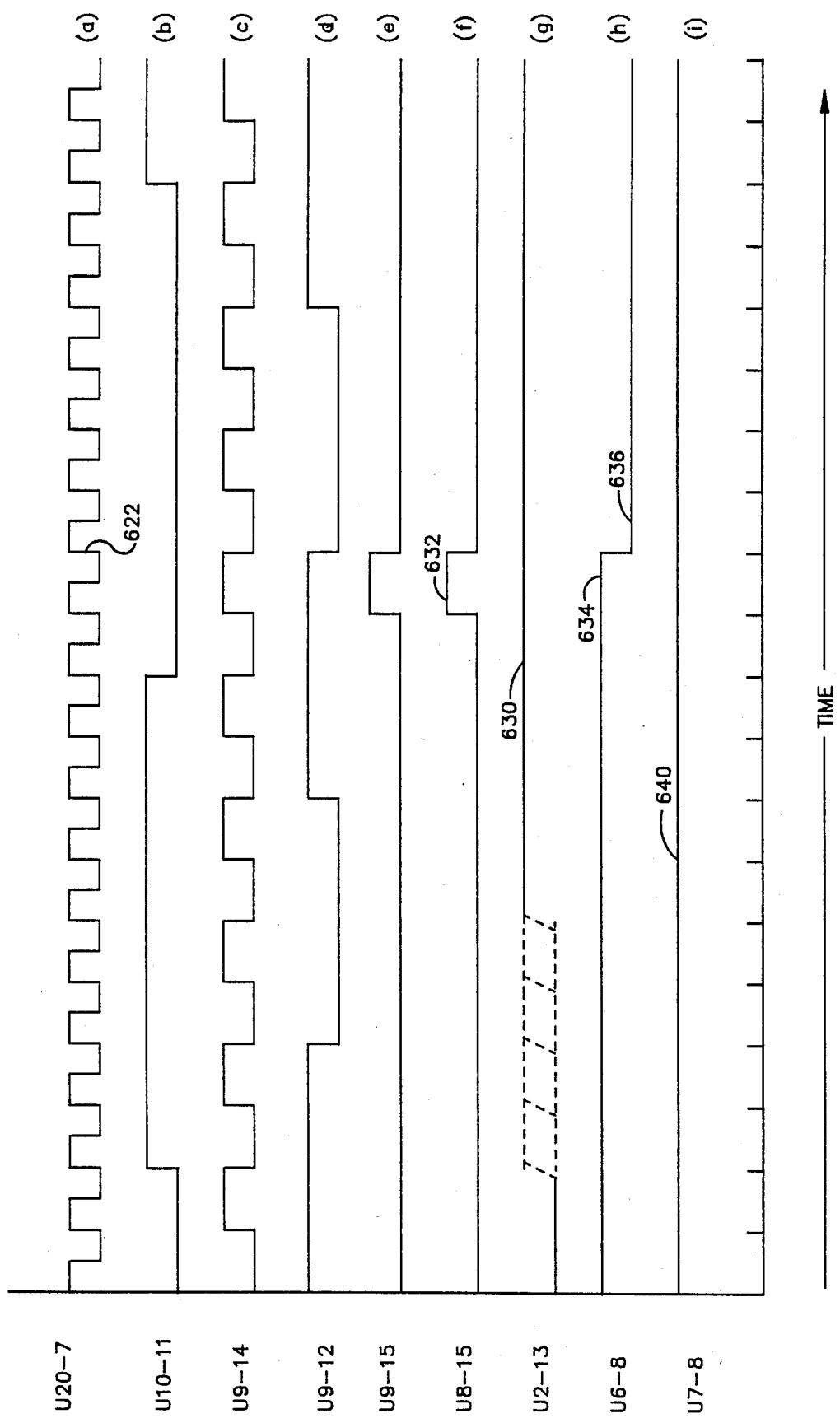
FIG. 6 is a timing diagram of the count adjust means responding to the change of signal level of the positive phase error signal, waveform (g), crossing the latched disable state, waveform (h), to change to a latched enable state at the next divided clock enable signal, waveform (f).

The divided clock enable signal from U8-15 is represented by waveform (f) as a transition from a low state to a high state 632 on FIG. 6. The divided clock enable signal from U8-15 is represented by waveform (f) as a transition from a low state at 718 to a high state 720 on FIG. 7. The divided clock enable signal from U8-15 is also represented by waveform (f) as a transition from a low state to a high state 832 on FIG. 8.

The count adjust means is responsive to the positive phase error signal via signal line 377 and the negative phase error signal via signal line 379 for providing the add count signal as an output on signal line 432, a skip count signal as an output on signal line 433 and a reset signal on signal line 357.

Figure 5:
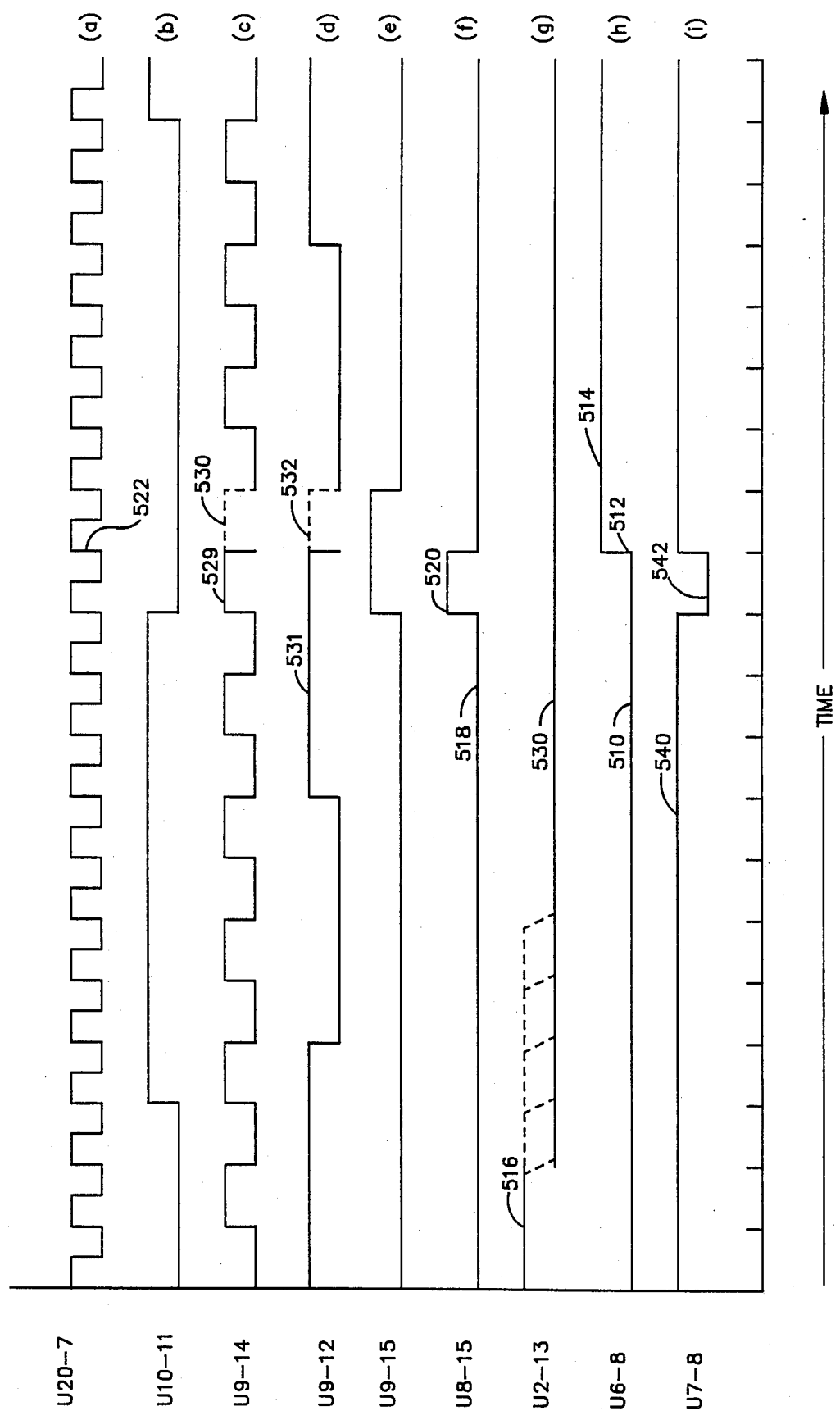
FIG. 5 is a timing diagram of the count adjust means responding to a positive phase error signal at U2-13, waveform (g), and generating a skip count signal from U7C-8, waveform (i) with the divided clock enable signal (f). The latched enable state signal at U6-8, waveform (h), changes to a latched disable state to prevent further skip counts from occurring until the positive phase error changes state. Waveforms (c) and (d) depict counter U9 skipping one count.

The count adjust means has an enabled state for providing a skip count signal from OR GATE U7-8 and a reset signal from U6-8 in response to a positive phase error signal, to a divided clock enable signal from U8-15 and to a multiple clock signal from U20 on signal line 362. Referring to FIG. 5, waveform (g) represents the positive phase error signal on signal line 359. The positive phase error signal is shown transitioning from a high state 516 to a low state 530.

Figure 7:
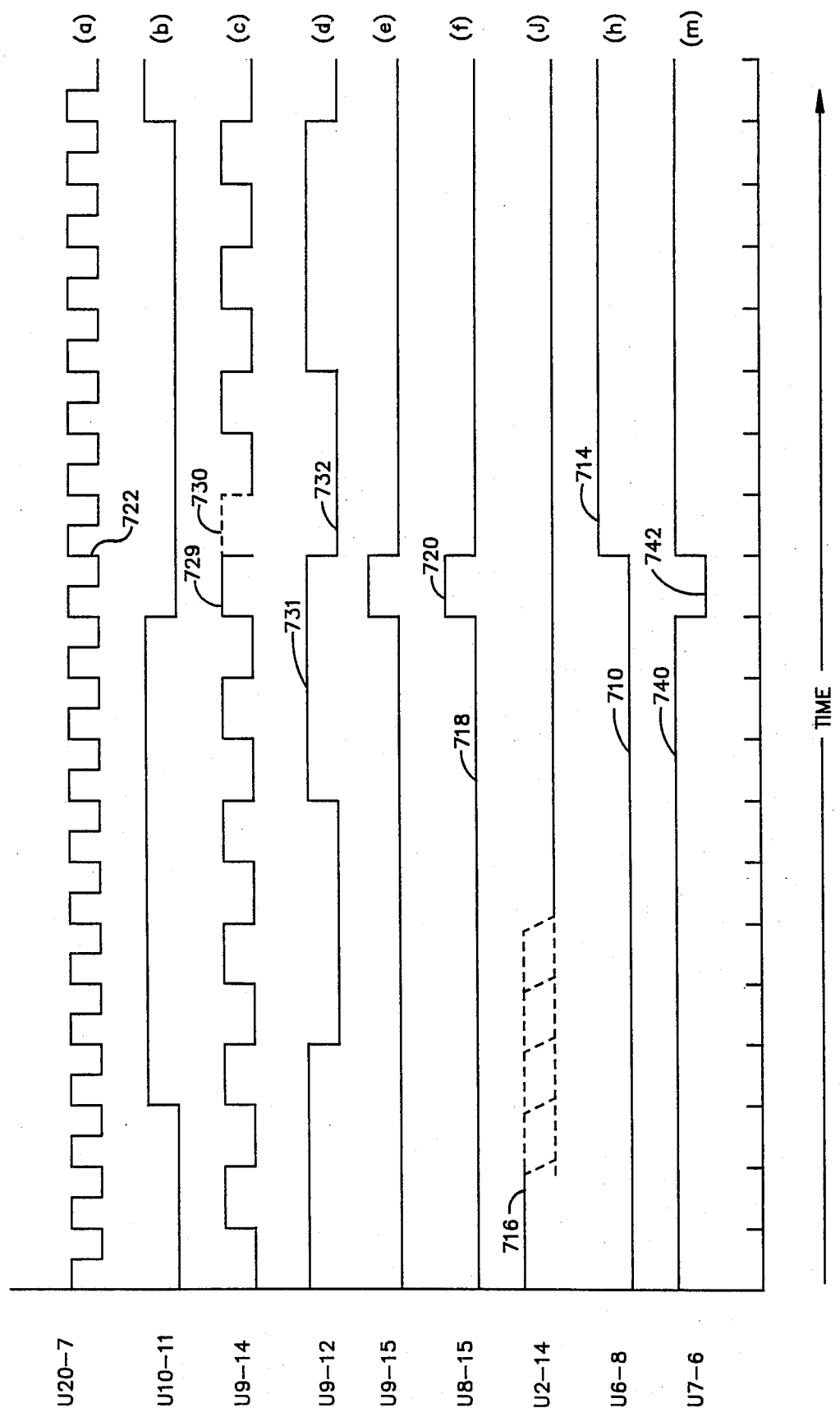
FIG. 7 is a timing diagram of the count adjust means responding to a negative phase error signal at U2-14, waveform (j), and generating a skip count signal from U7D-6, waveform (m) with the divided clock enable signal (f). The latched enable state signal at U6-8, waveform (h), changes to a latched disable state to prevent further skip counts from occurring until the negative phase error changes state. Waveforms (c) and (d) depict counter U9 adding one count.

The count adjust means enabled state is also characterized to provide an add count signal from OR GATE U7-6 and a reset signal from U6-8 in response to a negative phase error signal, to a divided clock enable signal and to a multiple clock signal. Referring to FIG. 7, waveform (j) represents the negative phase error signal on signal line 379. The negative phase error signal is shown transitioning from a high state 716 to a low state 730.

Referring to FIGS. 4 and to the timing diagrams of FIG. 5 and FIG. 7, the low state of the signal 510 and 710 out of U6-8 represents the enabled state of the count adjust means. This signal is referred to as the RESET SIGNAL on FIG. 4. The RESET SIGNAL resets the integrator 352 as it assumes a high state into analog switch 490 via signal line 357.

The RESET SIGNAL advances at 512 from a low state 510 to a high state 514 representing a skip count signal and at 712 from a low state 710 to a high state 714 representing an add count signal to advance the count adjust means from the enabled state to a disabled state immediately upon the production of a skip count signal or an add count signal.

FIG. 5 shows a skip count signal as waveform (i). Waveform (c) shows the output of counter U9-14 holding the same count for clock periods 529 and in phantom 530 and waveform (d) shows the output of counter U9-12 holding the same count for clock periods 531 and in phantom 532 as the skip count clock signal (i) transitions from a high 540 to a low 542 for one clock period. Holding the output of counter U9 high for an extra clock period obtains a delay of 45 degrees of the quad count signal, waveform (d) relative to the filtered frequency pilot reference signal, waveform (b).

FIG. 7 shows a add count signal as waveform (m). Waveform (c) shows the output of counter U9-14 incrementing the counter by two counts for clock periods 729 and phantom interval 730 and waveform (d) shows the output of counter U9-12 incrementing the counter by two counts for clock periods 731 and 732 as the add count clock signal (m) at U7-6 transitions from a high 740 to a low 742 for one clock period. Initializing counter U9 with a count of one (1) for the next clock period obtains a lead of 45 degrees of the quad count signal, waveform (d) relative to the filtered frequency pilot reference signal, waveform (b).

The output signal from D flip-flop U6-8 shown in FIG. 4 is normally in the low state with the integrated phase error signal being in a range bounded by VR1 and VR2. With the signal from U6-8 in low state, the divided clock enable signal can pass via inverter 468, or gate U7B and or gate U7C or U7D to provide a skip count signal or a add count signal shown in FIG. 5 as waveform (i) and in FIG. 7 as waveform (m).

The count adjust means is advanced to the disabled state to prevent the production of additional skip count signals or add count signals until the divided clock enable signal from U8-15 recurs concurrent with the removal of the initiating positive phase error signal via signal line 377 or the initiating negative phase error signal via signal line 379. A minimum of 256 multiple clock signals must occur before another divided clock enable signal can be provided at U8-15.

FIG. 5 shows the initiating positive phase error signal as waveform (g) as being initially high at reference number 516 in response to the integrated phase error signal on signal line 359 being less than the positive threshold voltage VR1 into comparator U2A. FIG. 7 shows the initiating negative phase error signal as waveform (j) as being initially high at reference number 716 in response to the integrated phase error signal on signal line 359 being more positive than the negative threshold voltage VR2 into comparator U2B. Referring to FIG. 4, the output of AND GATE U5 450 is high on signal line 452 in response to the outputs of both U2A and U2B being high. If the output of either U2A or U2B transitions from a high to a low state, the output of U5 on signal line 452 transitions from a high to a low state.

Referring to FIGS. 5 and 7, the outputs of U2A at pin 13 and U2B at pin 14 are shown transitioning from a high to a low state at varying times as waveforms (g) and (j) as the integrated phase error signal exceeds one of the threshold limits of U2A or U2B. D type flip-flop U6, 456 responds to the low state on signal line 452 when clocked by a low to high transition at its clock input.

Referring to FIGS. 5 and 7, waveform (a) on each represents the multiple clock signal on signal line 362 from U20-7. The multiple clock signal is ORed by U7A 454 with the inverted divided clock enable signal from U8-15. Referring to FIG. 5, the divided clock enable signal waveform (f) transitions from a low state 518 to a high state 520 every 256th multiple clock signal by operation of U9 and U8 as described above. The high state of U8-15 persists for one multiple clock signal interval during which the high state is inverted by inverter 468 and passed to an input of or gate U7A to enable the output of U7A to copy the multiple clock signal on signal line 362.

Referring to FIGS. 4 and 5, the multiple clock signal transitions from a low to a high at reference 522. The 522 transition is passed by or gate U7A to the clock input of U6 to cause flip-flop DFF3 to copy the state of the signal at its input on signal line 452 to its output as the RESET SIGNAL at U6-8.

FIG. 5 and FIG. show the RESET SIGNAL from U6-8 changing from a low state 510 to a high state 514 as the multiple clock signal at U20-7 changes from a low to a high state at transition 522. The multiple clock signal, waveform (a), must go through 256 additional cycles before the divide clock enable signal can again change the state of flip-flop DFF3. The high state 514 of waveform (h) remains high throughout the time required for an additional 256 multiple clock signals.

Referring to FIG. 4, the high state at U6-8 is coupled via signal line 357 to an input of or gate U7B, 458, and by U7B to its output and then to the inputs of U7C, 462 and U7D, 466 to force the outputs of U7C and U7D to a high state for as long as waveform (h) remains high, i.e. for a minimum period of 256 multiple clock signal cycles. Jamming the outputs of U7C and U7D to the high state inhibit divided clock enable signals, waveform (f) from generating further skip count or add count signals on signal lines 433 and 432 respectively.

Figure 8:
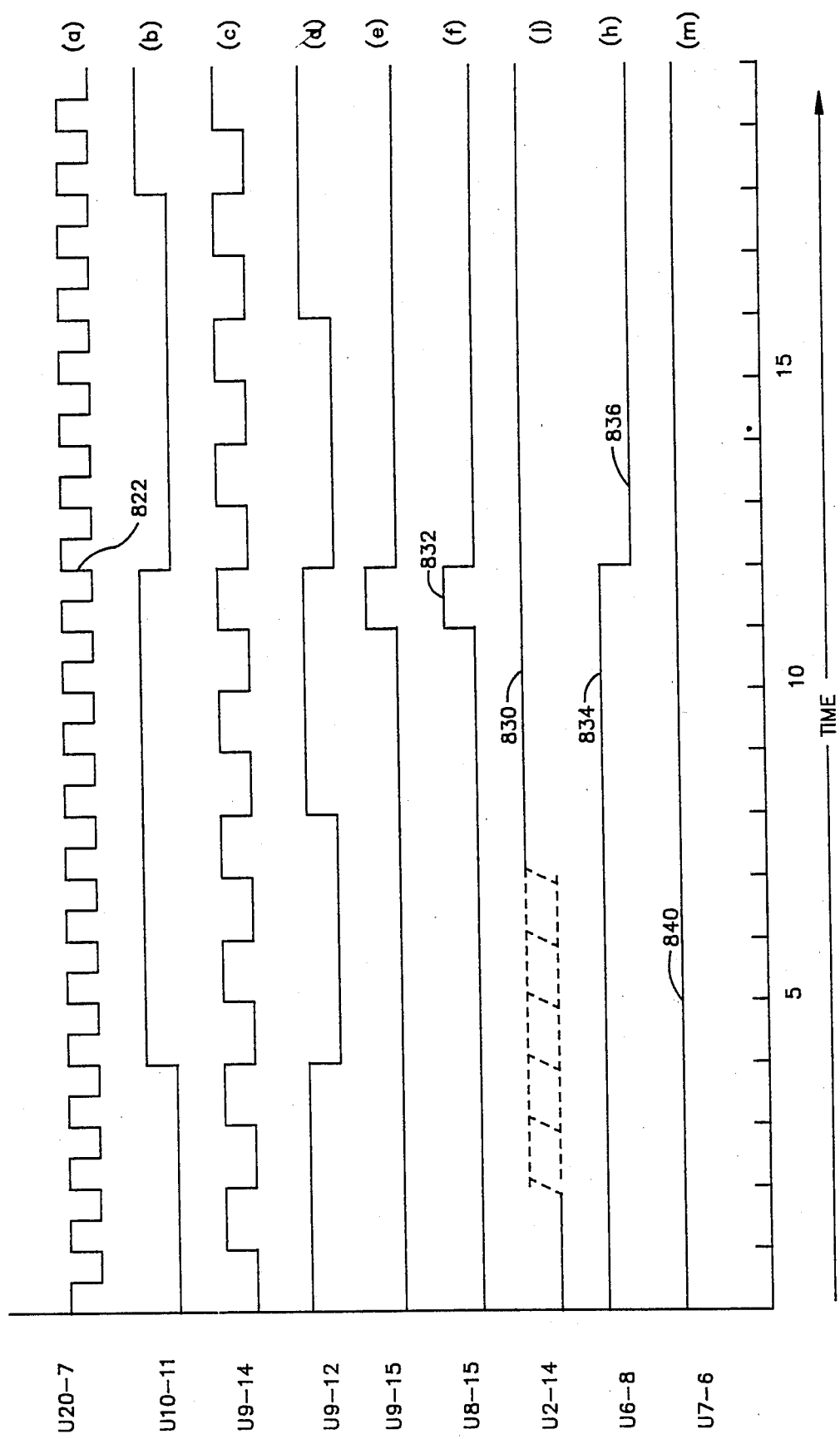
FIG. 8 is a timing diagram of the count adjust means responding to the change of signal level of the negative phase error signal, waveform (j), crossing the latched disable state, waveform (h), to change to a latched enable state at the next divided clock enable signal, waveform (f).

FIGS. 6 and 8 show the relationships between waveforms (a), (f), (g) and (h) as the system advances from a disabled state after having had a positive or negative phase error signal on signal lines 377 or 379 to an enabled state with the reset of the output of integrator 352 to zero. These waveforms show how the count adjust means enters the enabled state in response to the recurrence of the divided clock enable signal concurrent with the removal of the initiating positive phase error signal on signal lines 377 or the initiating negative phase error signals 379. Waveforms (i) and (m) represent the signals out of OR GATEs U7-C and U7-D at pin locations U7-8 and U7-6 respectively as being in the high state 840, 840 in the absence of a skip count or add count.

Referring now to FIG. 4, while in the high state, the RESET SIGNAL on signal line 357 closes the analog switch 490 to discharge capacitor 492 thereby driving the output of the integrator 352 to zero. As the output of integrator 352 drops into the range of voltage bounded by VR1 and VR2, the positive phase error signal or the negative phase error signal on 377, 379 will return to the high state as shown by waveform (g) on FIGS. 6 and waveform (j) on FIG. 8 at reference numbers 630 and 830 respectively. With the signal levels on signal lines 377 and 379 in the high state, the output from AND GATE U5, 450 goes to a high state and is coupled to the input of D flip-flop U6.

Referring to FIGS. 6 and 8, as waveform (f) goes high 632, 832 the clock input to D flip-flop U6 is enabled and U6-8 transitions from a high state 634, 834 to a low state 636, 836 at the next low to high transition of the multiple clock signal 622 on waveform (g) and 822 on waveform (j).

Referring to FIG. 4, phantom block 374 contains the Quad Count Signal Means The Quad Count Signal Means receives the multiple clock signal from the PLL 360. The multiple clock signal clock signal rate is determined by a selected compression ratio equal to a factor of 1, 2, 4 or 8 counter U9 in the Quad Count Signal Means receives the multiple clock signal from the PLL 360 and provides clock output rates multiplied by factors of ½ and ⅛ to the quadrature detector 380 and a clock signal output rate multiplied by 1/16 to counter U8. The U8 counter multiplies its input clock rate by 1/16 to provide a divided clock enable signal with an output rate of 468.75 Hz at a compression ratio of 1, to the count adjust means 376.

Referring to FIG. 4, the phase lock loop circuit has a phase detector U11 412 having a first input via signal line 358 responsive to the filtered frequency pilot reference signal and a second input responsive to a divided count signal on signal line 429 for providing a control signal at its output via resistor 413 to the input of VCO (voltage controlled oscillator) 414.

Resistors 413 and 415 in combination with resistor 417 and capacitor 416 represent a signal summing means responsive to the control signal from phase detector U11 and to the inverted integrated phase error signal from inverting unity gain amplifier 496 for providing a scaled control signal at the input of VCO 414. The values of resistors 413 and 415 are selected to insure that the PLL will always lock onto the frequency of the filtered frequency pilot reference signal.

The inverted integrated phase error signal is inserted into the summing network with insufficient gain to disturb frequency lock once achieved. The gain of the input for the inverted integrated phase error signal is sufficiently high to the inverted integrated phase error signal to shift the phase of the compression reference signal out of the VCO.

VCO 414 has an input responsive to the control signal from the phase detector U11 412 and an output for providing a compression reference signal at output terminal 419. The VCO has an output frequency characterized as an integer multiple of the filtered frequency pilot reference signal.

U21 represents a first counter having an input responsive to the compression reference signal for providing at least one integer submultiple, such as ½, of the compression reference signal, typically having a frequency of 960 KHz, as an output signal of 480 KHz.

U20 represents a MUX for selecting one of the outputs from counter U21 or for selecting the compression reference signal. The MUX provides the selected signal as the multiple clock signal to the input of the quad count signal means 374.

CTR2 represents a second counter having an input responsive to the multiple clock signal for providing one submultiple, such as 1/16 of the multiple clock signal as the divided count signal back to the second input of the phase detector 412.

I claim:

1. A demultiplexer circuit responsive to a composite input signal from a sonar bouy, said composite signal having signal components characterized as; a received audio signal having cosine and sine components, each component having an amplitude proportional to the amplitude of the received audio signal times the respective cosine and sine of the angle between the source of the audio signal and a frame reference referenced to the reference system of said sonar bouy receiving the audio signal, the cosine component being modulated by a reference carrier signal and the sine component being modulated by a quadrature reference carrier signal, said quadrature reference carrier signal being characterized as leading the reference carrier signal by 90 degrees;
  a constant amplitude fixed frequency pilot having a frequency equal to one half the frequency of said reference carrier signal; and,
  a constant amplitude phase pilot signal having a frequency equal to the frequency of said reference carrier signal, the phase pilot signal being phase shifted to lag the reference carrier signal by an angle equal to the sum of 90 degrees and an angle proportional to the heading angle measured between magnetic north and the reference axis of said reference frame;
  the demultiplexer circuit providing a north referenced output signal proportional to the amplitude of the received audio signal times the cosine of the angle between magnetic north and the reference frame reference axis and an east referenced output signal proportional to the amplitude of the received audio signal times the sine of the angle between magnetic north and the reference frame reference axis;
  said demultiplexer circuit comprising:
    filter and comparator means responsive to said composite signal for providing a filtered frequency pilot reference signal having a frequency equal to one half the frequency of said reference carrier signal; and,
    sine demodulator means responsive to said composite signal and to an east/west demodulator signal for providing said east referenced output signal;

cosine demodulator means responsive to said composite signal and to a north/south demodulator signal for providing a demodulated phase pilot signal and said north referenced output signal;

north/south filter means responsive to the output signals from said cosine demodulator means for filtering said demodulated phase pilot signal to provide said north referenced output signal;

a servo means responsive to said filtered frequency pilot reference signal and to said demodulated phase pilot signal for generating and controlling the phase of said north/south demodulator signal and said east/west demodulator signal using a single phase locked loop, said servo means being characterized to phase shift said north/south and east/west demodulator signals to adjust the outputs of said sine and cosine demodulator means to remove all error bias from said demodulated phase pilot signal, said error bias being measured with respect to a reference potential such as ground.

2. The demultiplexer circuit of claim 1 wherein said filter and comparator means further comprises:

a bandpass filter responsive to said composite signal, said bandpass filter having a center frequency set to equal one half of the reference carrier signal for providing a filtered frequency pilot signal; and, a comparator circuit referenced to a reference potential, such as ground, said comparator circuit being responsive to said filtered frequency pilot signal for providing said frequency pilot reference signal having a first logic state such as a logic one state in response to said filtered frequency pilot amplitude exceeding said reference potential and for providing a frequency pilot reference signal having a second logic state such as a logic zero state in response to said filtered frequency pilot amplitude being below said reference potential.

3. The demultiplexer circuit of claim 1 wherein said servo means further comprises:

an integrator circuit referenced to a referenced potential, such as ground, said integrator circuit being responsive to the error bias in said demodulated phase pilot signal for providing an integrated phase error signal and an inverted integrated phase error signal, said integrated phase error signal having a first polarity for a leading phase error between said north/south demodulator signal and said phase pilot signal and having a integrated phase error signal of a second polarity for a lagging phase error between said north/south demodulator signal and said phase pilot signal; said integrator circuit also being responsive to a reset signal for resetting said integrated phase error signal;

a threshold detector circuit responsive to said integrated phase error signal for providing a positive phase error signal in response to said integrated phase error signal exceeding a first threshold and a negative phase error signal in response to said integrated phase error signal exceeding a second threshold;

a phase lock loop circuit responsive to said inverted integrated phase error signal, to said filtered frequency pilot reference signal for providing a multiple clock signal;

a quadrature count signal means responsive to said multiple clock signal, to a skip count signal, and to an add count signal for dividing the frequency of the multiple clock signal by a first predetermined integer to provide a quadrature count signal, dividing the frequency of the multiple clock signal by a second predetermined integer to provide a quadrature count clock signal, and for dividing the frequency of the multiple clock signal by a third predetermined integer to provide a divided clock enable signal;

a quadrature detector circuit responsive to said quadrature count signal and said quadrature count clock signal for transferring the state of said quadrature count signal to the east west demodulator signal in response to a quadrature count clock signal to provide said east west demodulator signal and for transferring the state of said east west demodulator signal to said north south demodulator signal in response to said quadrature count clock signal to provide said north south demodulator signal, the east west demodulator signal being characterized to lead the north south demodulator signal by ninety degrees; and a count adjust means responsive to said multiple clock signal, said divided clock enable signal, said positive phase error signal, and said negative phase error signal for providing said add count signal, a skip count signal and a reset signal said count adjust means having an enabled state for providing a skip count signal and a reset signal in response to a positive phase error signal, a divided clock enable signal and a multiple clock signal; said count adjust means enabled state also being characterized for providing an add count signal and a reset signal in response to a negative phase error signal, a divided clock enable signal and a multiple clock signal;

said count adjust means being further characterized to advance from said enabled state to a disabled state immediately following the production of a skip count signal or an add count signal to prevent the production of additional skip count signals or add count signals until the divided clock enable signal recurs concurrent with the removal of the initiating positive phase error signal or the initiating negative phase error signals, said count adjust means entering said enabled state in response to the recurrence of said divided clock enable signal concurrent with the removal of the initiating positive phase error signal or the initiating negative phase error signals.

4. The demultiplexer circuit of claim 3 wherein said phase lock loop circuit further comprises:

a phase detector having a first input responsive to said filtered frequency pilot reference signal and a second input responsive to a divided count signal and an output for providing a control signal;

a signal summing means responsive to said control signal and to said inverted integrated phase error signal for providing a scaled control signal;

a voltage controlled oscillator having an input responsive to said control signal and an output for providing a compression reference signal having a frequency characterized as an integer multiple of said filtered frequency pilot reference signal;

a first counter having an input responsive to said compression reference signal for providing at least one integer submultiple of said compression reference signal as an output signal;

a MUX switch responsive to a compression ratio select signal for selecting said compression reference signal or said counter output signal and for providing said selected signal as said multiple clock signal;

a second counter having an input responsive to said multiple clock signal for providing one submultiple of said multiple clock signal as said divided count signal.

5. A demultiplexer circuit responsive to a composite input signal from a sonar bouy, said composite signal having signal components characterized as;

a received audio signal having cosine and sine components, each component having an amplitude proportional to the amplitude of the received audio signal times the respective cosine and sine of the angle between the source of the audio signal and a frame reference referenced to the reference system of said sonar bouy receiving the audio signal, the cosine component being modulated by a reference carrier signal and the sine component being modulated by a quadrature reference carrier signal, said quadrature reference carrier signal being characterized as leading the reference carrier signal by 90 degrees;

a constant amplitude fixed frequency pilot having a frequency equal to one half the frequency of said reference carrier signal; and, a constant amplitude phase pilot signal having a frequency equal to the frequency of said reference carrier signal, the phase pilot signal being phase shifted to lag the reference carrier signal by an angle equal to the sum of 90 degrees and an angle proportional to the heading angle measured between magnetic north and the reference axis of said reference frame;

the demultiplexer circuit providing a north referenced output signal proportional to the amplitude of the received audio signal times the cosine of the angle between magnetic north and the reference frame reference axis and an east referenced output signal proportional to the amplitude of the received audio signal times the sine of the angle between magnetic north and the reference frame reference axis;

said demultiplexer circuit comprising:

filter and comparator means having a bandpass filter responsive to said composite signal, said bandpass filter having a center frequency set to equal one half of the reference carrier signal for providing a filtered frequency pilot signal; and, a comparator circuit referenced to a reference potential, such as ground, said comparator circuit being responsive to said filtered frequency pilot signal for providing said frequency pilot reference signal having a first logic state such as a logic one state in response to said filtered frequency pilot amplitude exceeding said reference potential and for providing a frequency pilot reference signal having a second logic state such as a logic zero state in response to said filtered frequency pilot amplitude being below said reference potential; and, sine demodulator means responsive to said composite signal and to an east/west demodulator signal for providing said east referenced output signal;

cosine demodulator means responsive to said composite signal and to a north/south demodulator signal for providing a demodulated phase pilot signal and said north referenced output signal;

north/south filter means responsive to the output signals from said cosine demodulator means for filtering said demodulated phase pilot signal to provide said north referenced output signal;

a servo means responsive to said filtered frequency pilot reference signal and to said demodulated phase pilot signal for generating and controlling the phase of said north/south demodulator signal and said east/west demodulator signal using a single phase locked loop, said servo means being characterized to phase shift said north/south and east/west demodulator signals to adjust the outputs of said sine and cosine demodulator means to remove all error bias from said demodulated phase pilot signal, said error bias being measured with respect to a reference potential such a ground.

6. A demultiplexer circuit responsive to a composite input signal from a sonar bouy, said composite signal having signal components characterized as:

a received audio signal having cosine and sine components, each component having an amplitude proportional to the amplitude of the received audio signal times the respective cosine and sine of the angle between the source of the audio signal and a frame reference referenced to the reference system of said sonar bouy receiving the audio signal, the cosine component being modulated by a reference carrier signal and the sine component being modulated by a quadrature reference carrier signal, said quadrature reference carrier signal being characterized as leading the reference carrier signal by 90 degrees;

a constant amplitude fixed frequency pilot having a frequency equal to one half the frequency of said reference carrier signal; and, a constant amplitude phase pilot signal having a frequency equal to the frequency of said reference carrier signal, the phase pilot signal being phase shifted to lag the reference carrier signal by an angle equal to the sum of 90 degrees and an angle proportional to the heading angle measured between magnetic north and the reference axis of said reference frame;

the demultiplexer circuit providing a north referenced output signal proportional to the amplitude of the received audio signal times the cosine of the angle between magnetic north and the reference frame reference axis and an east referenced output signal proportional to the amplitude of the received audio signal times the sine of the angle between magnetic north and the reference frame reference axis;

said demultiplexer circuit comprising:

filter and comparator means responsive to said composite signal for providing a filtered frequency pilot reference signal having a frequency equal to one half the frequency of said reference carrier signal; and, sine demodulator means responsive to said composite signal and to an east/west demodulator signal for providing said east referenced output signal;

cosine demodulator means responsive to said composite signal and to a north/south demodulator signal for providing a demodulated phase pilot signal and said north referenced output signal;

north/south filter means responsive to the output signals from said cosine demodulator means for filtering said demodulated phase pilot signal to provide said north referenced output signal;

a servo means responsive to said filtered frequency pilot reference signal and to said demodulated phase pilot signal for generating and controlling the phase of said north/south demodulator signal and said east/west demodulator signal using a single phase locked loop, said servo means being characterized to phase shift said north/south and east/west demodulator signals to adjust the outputs of said sine and cosine demodulator means to remove all error bias from said demodulated phase pilot signal, said error bias being measured with respect to a reference potential such as ground said servo means having:

an integrator circuit referenced to a referenced potential, such as ground, said integrator circuit being responsive to the error bias in said demodulated phase pilot signal for providing an inverted integrated phase error signal, said inverted integrated phase error signal having a first polarity for a leading phase error between said north/south demodulator signal and said phase pilot signal and having an inverted integrated phase error signal of a second polarity for a lagging phase error between said north/south demodulator signal and said phase pilot signal;

said phase lock loop having;

a phase detector having a first input responsive to said filtered frequency pilot reference signal and a second input responsive to a divided count signal and an output for providing a control signal;

a signal summing means responsive to said control signal and to said inverted integrated phase error signal for providing a scaled control signal;

a voltage controlled oscillator having an input responsive to said control signal and an output for providing a compression reference signal having a frequency characterized as an integer multiple of said filtered frequency pilot reference signal;

a first counter having an input responsive to said compression reference signal for providing at least one integer submultiple of said compression reference signal as an output signal;

a MUX switch responsive to a compression ratio select signal for selecting said compression reference signal or said counter output signal and for providing said selected signal as said multiple clock signal; and a second counter having an input responsive to said multiple clock signal for providing one submultiple of said multiple clock signal as said divided count signal.

* * * * *